(12) United States Patent
Kuo

(10) Patent No.: US 6,500,721 B1
(45) Date of Patent: Dec. 31, 2002

(54) BIPOLAR THIN-FILM TRANSISTORS AND METHOD FOR FORMING

(76) Inventor: Yue Kuo, 6017 August Cir., College Station, TX (US) 77845

(*) Notice: Subject to any disclaimer, the term of this patent is extended or adjusted under 35 U.S.C. 154(b) by 0 days.

(21) Appl. No.: 09/564,342

(22) Filed: May 3, 2000

Related U.S. Application Data

(60) Provisional application No. 60/132,504, filed on May 4, 1999.

(51) Int. Cl.⁷ ............................................. H01L 21/331
(52) U.S. Cl. ........................ 438/367; 438/367; 438/315
(58) Field of Search .............................. 438/315, 334, 438/367

(56) References Cited

U.S. PATENT DOCUMENTS

| | | | |
|---|---|---|---|
| 4,889,823 A | * 12/1989 | Bertagnolli et al. | ........ 438/367 |
| 5,047,823 A | * 9/1991 | Treitinger et al. | .......... 257/559 |
| 5,481,120 A | 1/1996 | Mochizuki et al. | ............ 257/49 |
| 5,512,496 A | * 4/1996 | Chau et al. | .................. 438/315 |

OTHER PUBLICATIONS

Wolf, S.; Silicon Processing for the VLSI Era vol. 2: Process Integration, Sunset Beach, CA, 1990, pp. 506–518.*
Kuo, Yue; "Horizontally Redundant, Split–Gate a–Si:H Thin Film Tansistors," Journal of the Electrochem Society., vol. 143, No. 8, Aug. 1996, pp. 2680–2682.
Kuo, Yue; "Horizontally Redundant, Split–Gate a–Si:H Thin Film Transistors," Journal of the Electrochem Society., vol. 143, No. 8, Aug. 1996, pp. 2680–2682.

* cited by examiner

Primary Examiner—John F. Niebling
Assistant Examiner—Christopher Lattin

(57) ABSTRACT

A bipolar junction transistor includes a substrate, a first layer, a second layer, and a third layer. The first layer comprises non-single-crystalline semiconductor material having a first conductivity type deposited on the substrate. The second layer comprises non-single-crystalline semiconductor material having a second conductivity type deposited on at least a portion of the first layer. The third layer comprises non-single-crystalline semiconductor material having a conductivity type different than the second conductivity type deposited on at least a portion of the second layer. The first, second, and third layers form a collector, base, and emitter of the bipolar junction transistor.

1 Claim, 4 Drawing Sheets

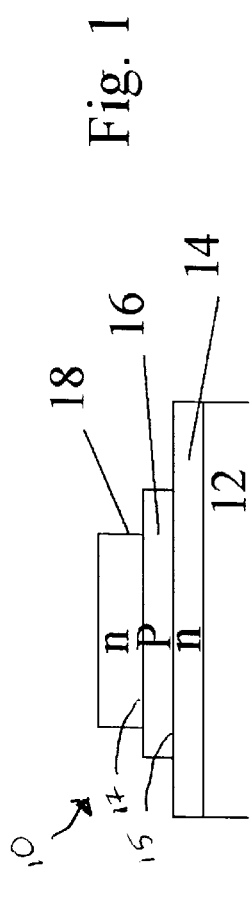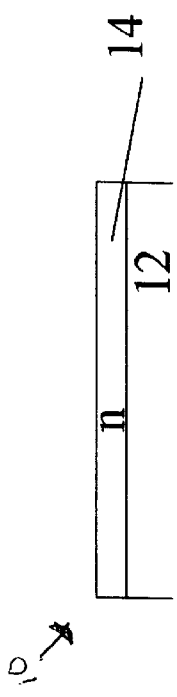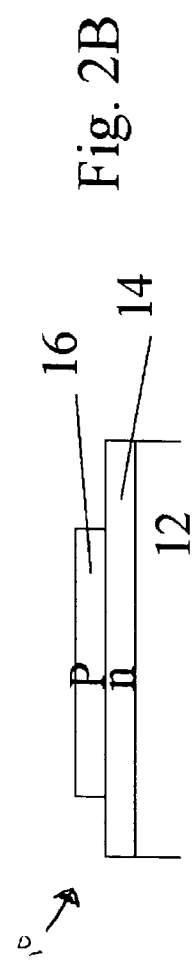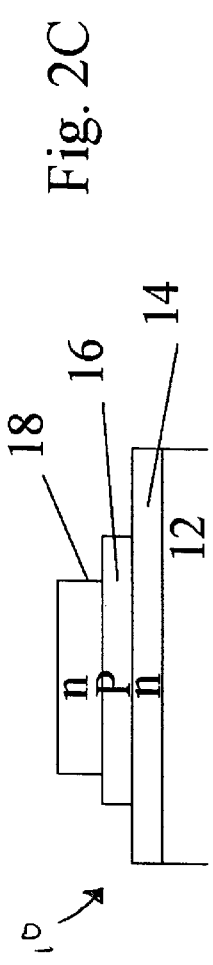

BIPOLAR THIN-FILM TRANSISTORS AND METHOD FOR FORMING

CROSS-REFERENCE TO RELATED APPLICATION

This application claims benefit under 35 U.S.C. Section 119 to U.S. provisional application entitled Bipolar Thin-Film Transistors and Method for Forming, filed May 4, 1999, having a Ser. No. of 60/132,504.

TECHNICAL FIELD OF THE INVENTION

This invention relates in general to the field of integrated circuits, and more particularly to bipolar thin-film transistors and method for forming same.

BACKGROUND OF THE INVENTION

Thin-film transistors are used in a variety of electronic devices such as high performance active matrix liquid crystal displays, two dimensional medical imagers, sensors, artificial retinas, ring oscillators, and high energy particle detectors. Conventional thin-film transistors are field-effect transistors. Field effect transistors contain three electrodes, source, a drain, and a gate. During transistor operation, current flows from the source to the drain, and the magnitude of that current is controlled by a voltage applied to the gate. The thin-film transistor performance is significantly influenced by characteristics of the interface between the semiconductor and an adjacent dielectric.

These thin-film transistors are generally made from amorphous silicon or polycrystalline silicon. An amorphous silicon thin-film transistor can be fabricated in an array form on large substrates (such as 600 mm by 720 mm glass) at low temperature (such as less than 350° C.) with high throughputs. A polycrystalline silicon thin-film transistor generally utilizes a high temperature crystallization, or deposition step, which restricts the number of suitable substrates. Although there are low temperature polycrystalline silicon thin film processes, such as excimer laser crystallization and solid phase crystallization methods, processing time for such methods is usually excessive as compared to the requirements for mass production on very large substrates.

There are two major drawbacks with conventional amorphous silicon thin-film transistors: high photoleakage and low field-effect mobility. The high photoleakage problem has been addressed by the addition of a light blocking layer, such as a metal or a black polymer film, above the thin-film transistors. Conventional thin-film transistors have a maximum mobility of less than about 1.5 $cm^2$/Vs. This level of mobility is proper for some simple local operations such as the pixel switching of a LCD; however, the low mobility greatly restricts the application of thin-film transistors to many advanced products. For example, amorphous silicon thin-film transistors generally cannot be used to build driving circuits of a LCD. Further, many electronic designs require a higher mobility, such as greater than 10 $cm^2$/Vs.

A bipolar transistor may have a higher operating speed than a conventional field-effect transistor (FET), such as a metal-oxide-semiconductor (MOS) transistor. Conventional bipolar transistors are fabricated based on a single crystal silicon wafer. One of the major yield loss factors is the shortening of the emitter and collector regions (also known as piping) due to base-region crystal defect caused by contamination or other factors. Conventional bipolar transistors are prepared on an epitaxy film that is deposited at a high temperature, e.g., above 950° C. The out diffusion of the dopant from the collector region greatly limits the minimum base region thickness. Therefore, due to the high temperature, the base and collector concentration profiles are not abrupt.

SUMMARY OF THE INVENTION

In accordance with the present invention, a bipolar thin-film transistor and method for forming same is provided that addresses disadvantages and problems associated with conventional transistors.

According to one embodiment of the invention, a bipolar transistor includes a substrate, a first layer, a second layer, and a third layer. The first layer comprises non-single-crystalline semiconductor material having a first conductivity type deposited on the substrate. The second layer comprises non-single-crystalline semiconductor material having a second conductivity type deposited on at least a portion of the first layer. The third layer comprises non-single-crystalline semiconductor material having a conductivity type different than the second conductivity type deposited on at least a portion of the second layer. The first, second, and third layers form a collector, base, and emitter of the bipolar junction transistor.

According to another embodiment of the invention, a method for fabricating a bipolar transistor includes depositing a first layer of semiconductor materials to form a first transistor region, depositing a second layer of semiconductor material over at least a portion of the first layer to form a base of the transistor, and depositing a third layer of semiconductor material over at least a portion of the second layer to form a third transistor region.

The present invention provides various technical advantages over current thin film transistors including higher mobility, higher yield and greater flexibility in transistor structure. In addition, the present invention also has advantages over conventional silicon wafer based thin film transistors including higher yield, lower process temperatures, and less restrictions on size and material of substrates.

Other advantages may be readily ascertainable by those skilled in the art and the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numbers represent like parts, and which:

FIG. 1 is a cross-sectional view of a completed bipolar thin-film transistor according to one embodiment of the invention;

FIGS. 2A through 2C are cross-sectional views of the bipolar thin-film transistor of FIG. 1 in various states of fabrication, according to one embodiment of the invention;

DETAILED DESCRIPTION OF EMBODIMENTS OF THE INVENTION

Figure 3:
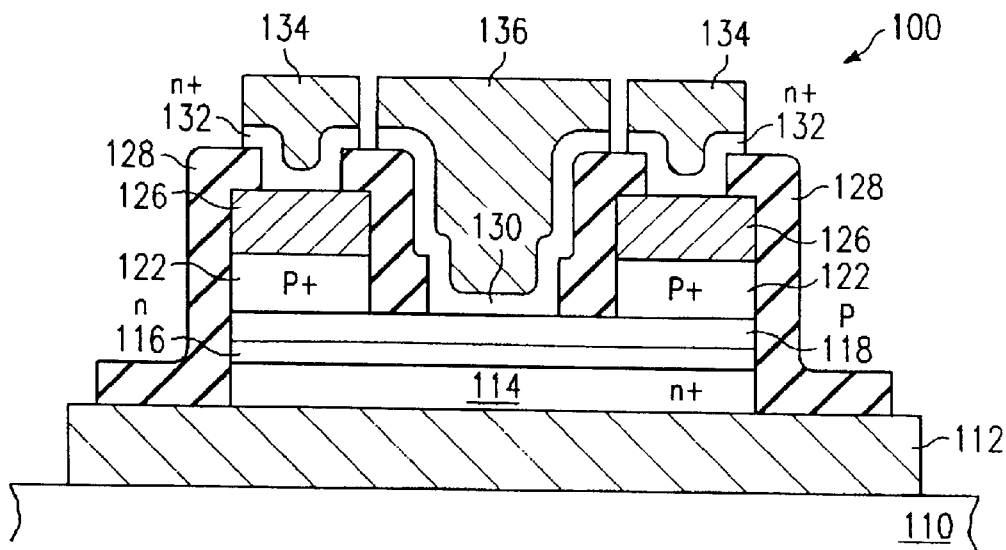
FIG. 3 is a cross-sectional view of an alternate embodiment of a bipolar thin-film transistor according to the teachings of the inventory.

Embodiments of the invention and its advantages are best understood by referring to FIGS. 1 through 7 of the drawings, like numerals being used for like and corresponding parts of the various drawings.

FIG. 1 is a cross-sectional view of a completed bipolar thin-film transistor 10. Transistor 10 is a junction-effect transistor that may have a higher mobility than conventional field-effect thin-film transistors. Transistor 10 comprises a substrate 12, a first semiconductor region formed from a layer 14, a second semiconductor region formed from a layer 16, a third semiconductor region formed from a layer 18, an isolation region 20, and a conductive region 22. According to the teachings of the invention, layers 14, 16, 18 may be formed by thin-film deposition processes, such as low pressure chemical vapor deposition or plasma enhanced chemical vapor deposition. Since only non-single crystalline materials, such as, for example, amorphous, microcrystalline or polycrystalline films, are deposited, the deposition temperature can be much lower than for single crystalline silicon (epitaxy) deposition. Low temperature deposition allows a wide variety of substrate materials, more economical fabrication, and more desirable transistor structure.

In this example, substrate 12 is formed from glass; however, any suitable substrate material upon which a semiconductor material may be deposited may be used for substrate 12 including plastics, ceramics, insulated-coated metals, or other suitable materials. Overlying substrate 12 is a deposited layer 14 of non-single-crystalline semiconductor material. This material may comprise, for example, amorphous silicon, polysilicon, or microcrystalline silicon. Other suitable semiconductor materials include cadmium, selinide, etc. In this example, layer 14 is formed from deposition of an n-type material to form a collector of the resulting bipolar junction transistor 10.

Layer 16 forms a base of transistor 10. Layer 16 comprises deposited non-single-crystalline semiconductor material such as the materials described above in conjunction with layer 14. In this example, layer 16 is formed from deposition of P-type material to form the base of the resulting bipolar transistor 10. Overlying a portion of layer 16 is layer 18, which serves as the emitter. Layer 18 is formed by deposition of a non-single-crystalline semiconductor material, such as those described above in conjunction with layer 14. In this example, layer 18 is formed from deposition an n-type material to form the emitter of the resulting bipolar junction transistor 10.

A junction 15 between layer 14 and layer 16 forms a collector-base junction. A junction 17 between base 16 and emitter 18 form an emitter-base junction.

Region 14 serves as a collector; layer 18 serves as an emitter; and layer 16 serves as a base. Conductive regions (not explicitly shown) to layers 14, 16, 18 can be formed from any suitable conductive material, such as a metal or a highly-doped semiconductor material.

Each of layers 14, 16, 18 may be made of a homogeneous or heterogenous material, and may have single- or multi-layer structures. For example, layer 16, serving as the base, may be made of amorphous silicon, amorphous silicon-germanium or silicon-carbon films. Layer 16 may also comprise a stacked layer of amorphous silicon and germanium or an amorphous silicon with amorphous carbon. In a stacked configuration, some films may not be in amorphous form, for example, certain films may be polycrystalline, however, best results are obtained if use of polycrystalline does not cause leakage between the emitter and the collector (layers 18 and 14, respectively).

Chemical vapor depositions methods may be used to deposit semiconductor layers 14, 16, and 18 on large area substrates with high throughputs. Because the power consumption of a bipolar transistor is usually influenced by the base layer thickness, layer 16 may be very thin to minimize power conception. One suitable thickness for layer 16 is 100Å.

Because the emitter, base, and collector layer (layers 18, 16 and 14) are deposited (as opposed to being formed by implantation or doping of single-crystalline semiconductor material) by low temperature processes, junctions 15 and 17 may be very sharp due to very low auto-doping and interface mixing. Low auto-doping and interface mixing is difficult to achieve in conventional single crystal silicon bipolar drain system fabrication processes because those processes require a high temperature epitaxy deposition process.

A transistor according to the teachings of the invention, such as transistor 10, may be fabricated into two- or three-dimensional array form for many advanced electrical or opto-electrical applications. These arrays can be manufactured on small (such as VLSI) or large (such as imagers or LCDs) substrates. The minimum dimension of the transistor is dependent on the lithography and etching tools and processes.

Thus, transistor 10, according to the teachings of the invention, can be applied to a large range of products with almost no substrate size and material limits. The speed of bipolar transistor 10 may be faster than that of conventional thin-film field effect transistors.

FIGS. 2A through 2C are cross-sectional views of bipolar thin-film transistor 10 in various states of fabrication, according to one embodiment of the invention. Layer 14 is deposited overlying substrate 12. As described above, layer 14 may be deposited by a chemical vapor deposition or other suitable technique. In particular, a layer 14 may be deposited according to low temperature, such as less than 350° C., thin film processes such as low pressure chemical vapor deposition or plasma enhanced chemical vapor deposition. Layers 16 and 18 are deposited overlying layer 14 and 16 respectively, in a similar fashion. Layer 16 may be formed very thin, such as 100Å, to reduce consumption of transistor 10. Although suitable transistors may be fabricated according to the above description, a particularly advantageous embodiment may be constructed by forming layer 16, which serves as the base of transistor 10, from a material having amorphous morphology to avoid formation of a piping defect that often adversely affects single-crystalline silicon bipolar transistors.

Contacts to films 14, 16, and 18 can be formed by patterned metal or heavily-doped films (not explicitly shown). Each contact region should be isolated.

Figure 4A:
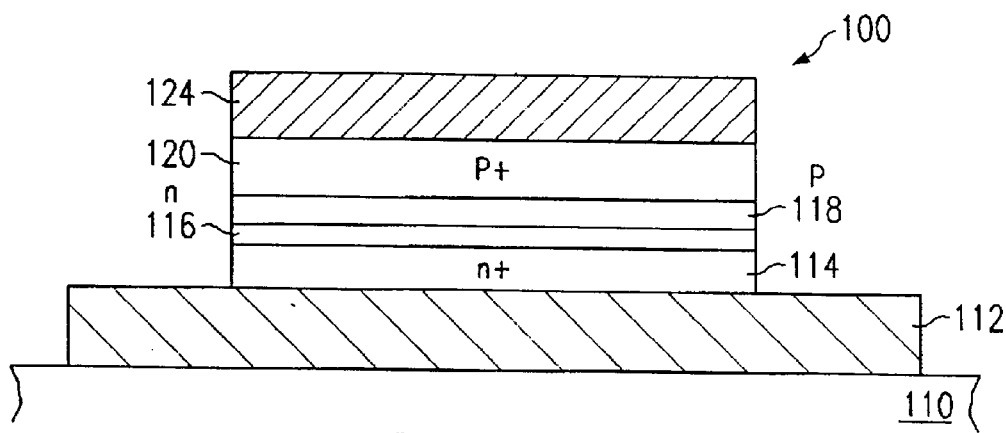
FIGS. 4A through 4C are cross-sectional views of the bipolar thin-film transistor of FIG. 3 in various states of fabrication, according to one embodiment of the teachings of the invention.
Figure 4B:
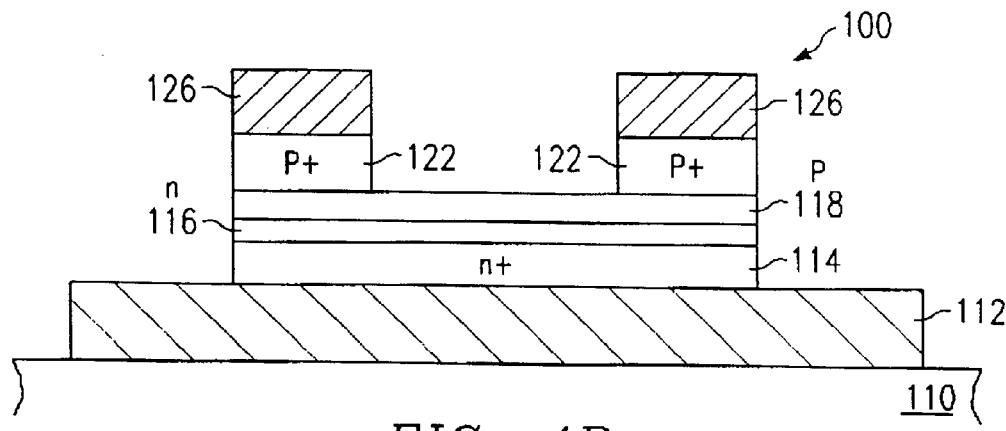
Figure 4C:
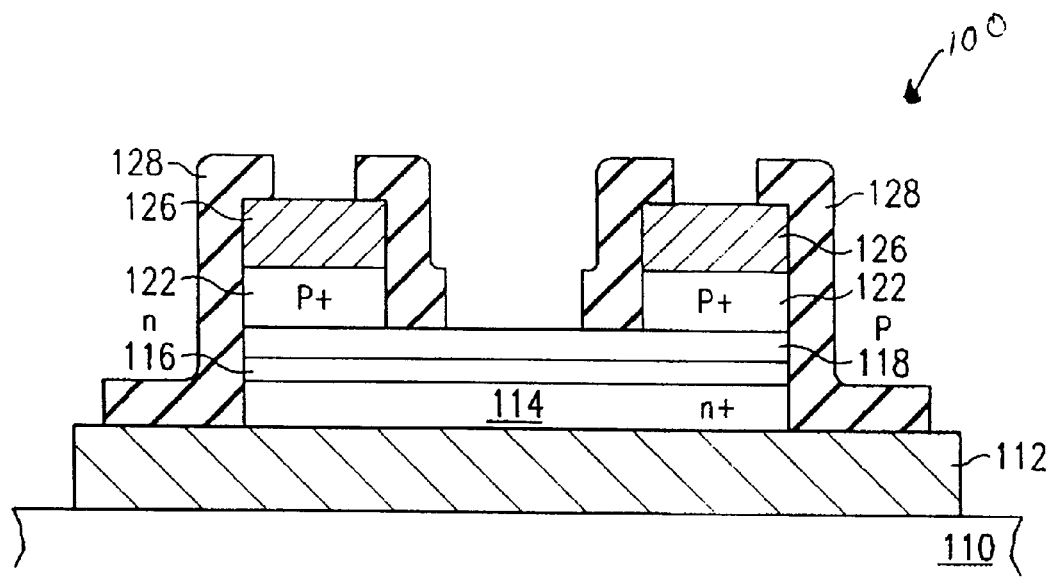

FIG. 3 is a cross-sectional view of an alternate embodiment of a bipolar thin-film transistor 100 according to the teachings of the invention. Transistor 100 is a particular example of a bipolar thin-film transistor constructed according to the teachings of the invention. Transistor 100 includes basic emitter, base, and collector regions and electrodes for each region as well as dielectric regions to separate the electrodes. A method for fabricating transistor 100 and details of its components are described below in conjunction with FIGS. 4A through 4C. FIGS. 4A through 4C are cross-sectional views of a bipolar thin-film transistor of FIG. 3 in various states of fabrication, according to one embodiment of the teachings of the invention.

FIG. 4A illustrates an intermediate structure of six thin film layers formed on a substrate 110. Layers are etched with a wet or dry (plasma etching) method using a first mask. Layers 112, 114, 116, 118, and 120 are deposited sequentially on substrate 110, which may be glass, plastic, metal, or other suitable material. Layers 112 and 124, which both comprise deposited metals may be formed from the same or different metal. Alternatively, in another embodiment, layer 120 may be omitted resulting in a base for transistor 100 that comprises only a layer 118 of P-type material. This results in the direct contact between the base electrode (126) and the base layer (118).

Layers 112, 114, 116, 118 and 120 are all deposited by low temperature thin-film processes, such as low pressure chemical vapor deposition or plasma-enhanced chemical vapor deposition or sputtering. In this example, layer 112 is a metal; layer 114 is a heavily n-type doped amorphous silicon; layer 116 is formed by deposition of an n-type doped amorphous silicon; layer 118 is formed by deposition of a P-type doped amorphous silicon; layer 120 is formed from a heavily doped P-type amorphous silicon; and layer 124 is formed by deposition of a metal. Layers 112, 114, and 116 will serve as a collector region (including the electrode and ohmic contact) for transistor 100. Layers 118, 120, and 124 will serve as a base region (including the electrode and ohmic contact) for transistor 100.

FIG. 4B illustrates an intermediate structure of transistor 100 after part of layers 120 and 124 were etched off using a second mask. Both layers 120 and 124 may be wet or dry (plasma) etched. This etching exposes layer 118, which forms a part of the base of transistor 100, to allow formation of a base-emitter junction. This etching also forms base regions 122 and base electrodes 126.

FIG. 4C illustrates an intermediate structure of transistor 100 after a dielectric film 128 is deposited and etched using a third mask. The emitter area and the base contact regions are defined in this step. Dielectric layer 128 is etched with a wet or dry etching process.

The complete transistor 100, illustrated in FIG. 3, is finished after an n-type layer 132 and metal layer 134 are deposited and etched using a fourth mask. N-type layer 130 forms the emitter of transistor 100. Regions 134 and 136 provide contact to the base and emitter, respectively, of transistor 100.

The resulting transistor 100 provides the same advantages described above in conjunction with transistor 10; however, all emitter, base, and collector regions have ohmic contacts and metal electrodes, which are useful for high performance transistors.

Figure 5:
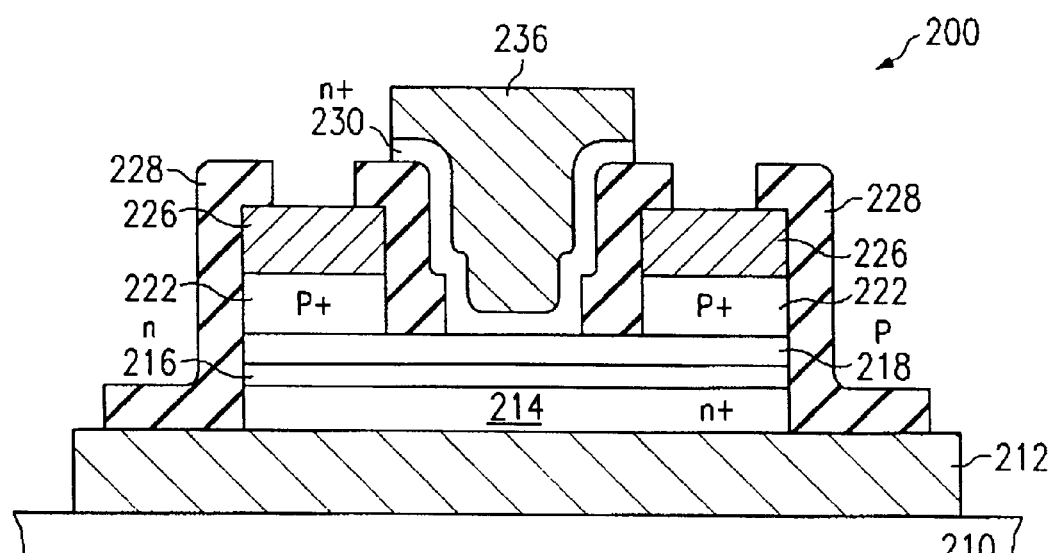
FIG. 5 is a cross-sectional view of yet another alternate embodiment of a bipolar thin-film transistor according to the teachings of the invention.

FIG. 5 is a cross-section of yet another alternate embodiment of a bipolar thin-film transistor 200 according to the teachings of the invention.

Transistor 200 is substantially similar to transistor 100; thus, substrate 210 is similar to substrate 110; layers 212, 214, and 216 are similar to layers 112, 114, and 116; dielectric layer 228 is similar to dielectric layer 128; n-type layer 230 is similar to n-type layer 130; and region 236 is similar to region 136. According to this embodiment, metal region 134 and portions of n-type layer 132 are removed, exposing regions 226 to allow a more direct contact to regions 222 and layer 218, collectively forming a base of transistor 200. This transistor provides additional advantages in that the base contact structure is much simpler to fabricate. Transistor 200 may be formed according to techniques analogous to those described in conjunction with FIGS. 4A through 4C.

Figure 6:
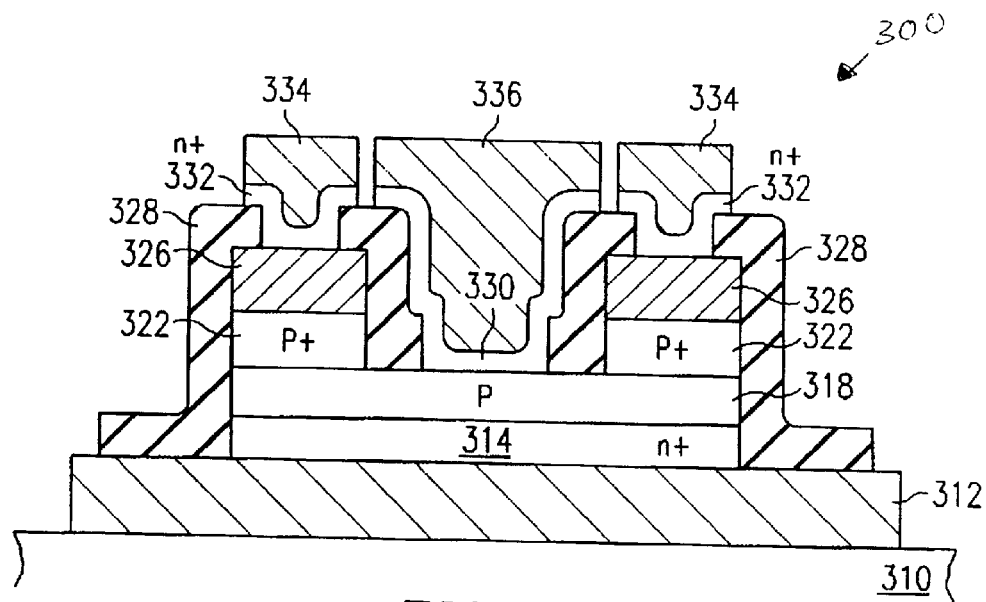
FIG. 6 is a cross-sectional view of a further alternate embodiment of a bipolar thin-film transistor according to the teachings of the invention.

FIG. 6 is a cross-sectional view of yet another alternate embodiment of a bipolar thin-film transistor 300 according to the teachings of the invention. Transistor 300 is substantially similar to transistor 100, except that layer 116, comprising an n-type material is omitted; thus, substrate 310 is similar to substrate 110; layer 312 is similar to layer 112; region 322 is similar to base region 122; base electrode 326 is similar to base electrode 126; dielectric layer 328 is similar to dielectric layer 128; n-type layer 330 is similar to n-type layer 130; n-type layer 332 is similar to n-type layer 132; metal layer 334 is similar to metal layer 134; and region 336 is similar to region 136. According to this embodiment, layer 314, comprising an n-type material, directly contacts layer 318, comprising a P-type material. This structure is easier to fabricate because of omission of a deposition layer. Transistor 300 may be formed according to techniques analogous to those described in conjunction with FIGS. 4A through 4C.

Figure 7:
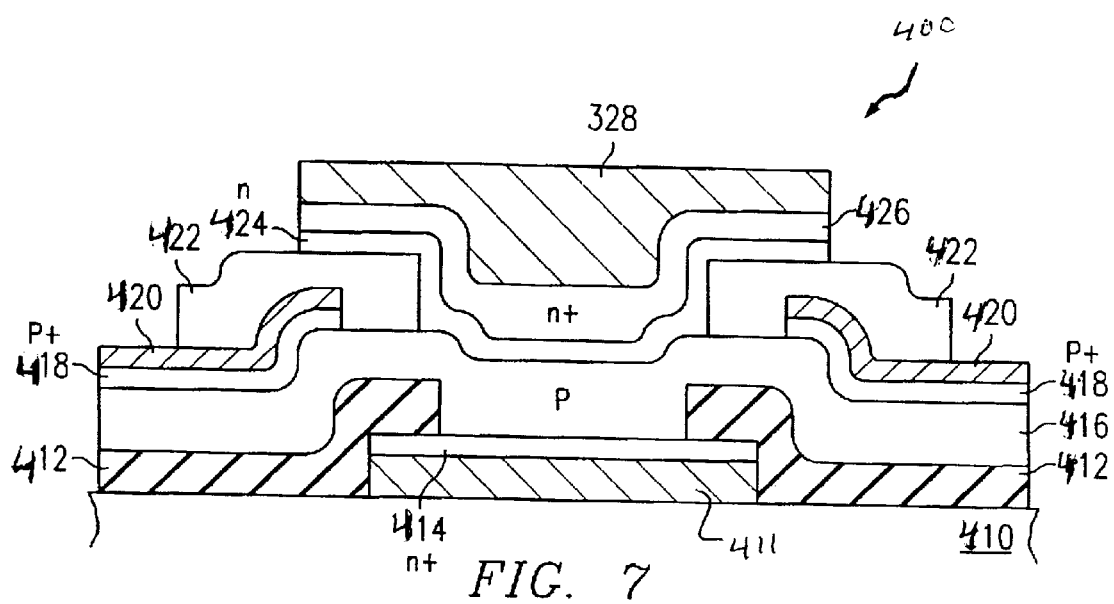
FIG. 7 is a cross-sectional view of yet another alternate embodiment of a bipolar thin-film transistor with an emitter at the base of the structure.

FIG. 7 is a cross-sectional view of yet another alternate embodiment of a bipolar thin-film transistor 400, with an emitter at the bottom of the transistor. Transistor 400 may be fabricated in a similar manner to transistor 100, except that film deposition order is reversed, resulting in the collector being formed at the top of transistor 400 structure and the emitter being formed at the bottom of transistor 400 structure.

As illustrated in FIG. 7, a metal 411 is deposited on substrate 410. Overlying metal region 411 is an n-type region of semiconductor material. Region 414 forms the emitter of transistor 400. Regions 416 and 418, which comprise P and P+ materials, respectively, form the base of transistor 400. Layer 412 is formed from a dielectric material and isolates layer 411 from layer 416. Layers 426 and 424 form the collector of transistor 400. Alternatively, layer 424, comprised of an n-type material, may be omitted, which results in a simpler deposition process. Layer 426 is formed from an n-type semiconductor material and layer 424 is formed from an n-type semiconductor material. Layer 428 is formed from metal and provides a contact to the collector of transistor 400.

Region 422 is formed from a dielectric layer (such as silicon-nitride or oxide) and is used to separate the base and collector contact regions. Region 420 is formed from deposition of a metal.

Thus, it is apparent that there has been provided in accordance with the present invention bipolar thin-film transistors and method for forming same that satisfy the advantages set forth above, such as providing higher mobility, higher yield, lower process temperatures, and fewer restrictions on size and material of substrates. Although the present invention and its advantages have been described in detail, it should be understood that various changes, substitutions, and alterations readily apparent to those skilled in the art may be made without departing from the spirit and the scope of the present invention.

What is claimed is:

1. A method for fabricating a bipolar transistor, comprising:

depositing a first metal layer on a substrate;

depositing a first heavily doped n-type amorphous silicon layer over the first metal layer;

depositing an n-type amorphous silicon layer over the first heavily doped n-type amorphous silicon layer;

depositing a p-type amorphous silicon layer over the n-type amorphous silicon layer;

depositing a heavily doped p-type amorphous silicon layer over the p-type amorphous silicon layer;

depositing a second metal layer over the heavily doped p-type amorphous silicon layer;

etching portions of the second metal layer and the heavily doped p-type amorphous silicon layers to form a preliminary structure;

depositing a dielectric layer deposited over the preliminary structure;

patterning and etching the dielectric layer;

depositing a second heavily doped n-type amorphous silicon layer over at least portions of the dielectric layer and the deposited p-type silicon layer;

depositing a third metal layer over at least portions of the second heavily doped n-type amorphous silicon layer; and etching portions of the third metal layer and second heavily doped n-type amorphous silicon layer.

* * * * *

UNITED STATES PATENT AND TRADEMARK OFFICE
CERTIFICATE OF CORRECTION

PATENT NO.   : 6,500,721 B1
DATED        : December 31, 2002
INVENTOR(S)  : Yue Kuo It is certified that error appears in the above-identified patent and that said Letters Patent is hereby corrected as shown below:

<u>Title page,</u>
Item [76], after "(76) Inventor: Yue Kuo, 6017 August Cir., College Station, TX (US) 77845" insert -- [73] Assignee: The Texas A&M University System, College Station, TX (US) --.

Signed and Sealed this

Fifth Day of August, 2003

JAMES E. ROGAN
*Director of the United States Patent and Trademark Office*